United States Patent [19]
Campbell

[11] Patent Number: 5,533,473
[45] Date of Patent: Jul. 9, 1996

[54] OPTICALLY SWITCHED HIGH VOLTAGE DISTRIBUTOR

[75] Inventor: Hugh P. Campbell, Gardena, Calif.

[73] Assignee: Xerox Corporation, Stamford, Conn.

[21] Appl. No.: 492,359

[22] Filed: Jun. 19, 1995

[51] Int. Cl.⁶ .......................................................... F02P 7/02
[52] U.S. Cl. ................................... 123/146.50 A; 123/613
[58] Field of Search ............................. 123/146.5 A, 613, 123/643; 250/208.4, 214 SW; 200/19 R

[56] References Cited

U.S. PATENT DOCUMENTS

| | | | |
|---|---|---|---|
| 4,267,803 | 5/1981 | Formato | 123/146.5 A |
| 5,002,034 | 3/1991 | Herden et al. | 123/643 |

FOREIGN PATENT DOCUMENTS 57-163160  10/1982  Japan ...................................... 123/613

*Primary Examiner*—Tony M. Argenbright
*Attorney, Agent, or Firm*—Nola Mae McBain

[57] ABSTRACT

High voltage switches distribute ignition voltages to spark plugs of an internal combustion engine. A high-voltage switch uses an array of high voltage semiconductor transistors mounted on a single insulated substrate. The high voltage array requires only a single transistor working with a single photo-diode to trigger the array. A light source is mounted in the center of a distributor cap and light from the light source is directed into a light directing rotor. The light directing rotor is designed to reflect light to the photo-diode trigger of each high voltage array. The control circuitry is operated with low voltage.

6 Claims, 2 Drawing Sheets

OPTICALLY SWITCHED HIGH VOLTAGE DISTRIBUTOR

BACKGROUND

This invention relates generally to a contactless optically switched ignition system for internal combustion engines and more particularly concerns a contact type distributor found in many vehicles that converts easily into a contactless optically switched distributor for use in a contactless optically switched ignition system.

A contactless distributor has increased engine reliability and consistent performance over time compared to contact type distributors. Consistent performance over time will decrease amounts of pollution generated by an engine over a vehicle's lifetime. This contactless distributor has the advantage of making use of existing mechanical parts of an existing contact type distributor already found in many automobiles. The mechanical portions of the distributor remain unchanged while replacing only the rotor and distributor cap with optical, non-contacting elements.

In the past high voltage switching components have generally been so large in nature that they have not been able to be packaged within the dimensional constraints of a standard distributor cap. The extremely compact nature of new high-voltage arrays, such as Ser. No. 08/434,635, "A Method of Producing an Electrically Isolated, Uniformly Spaced Array of Transistors or Transistor Blocks," by Buhler et. al., filed on May 1, 1995, assigned to Xerox Corporation and hereby incorporated by reference and Ser. No. 08/434,634, "An Electrically Isolated, Uniformly Spaced Array of Transistors or Transistor Blocks," filed on May 1, 1995, by Buhler et. al., assigned to Xerox Corporation and hereby incorporated by reference allows for the incorporation of the high-voltage switches into the distributor cap along with optical elements.

Accordingly, it is the primary aim of the invention to provide an optically switched distributor for use with an engine ignition system.

Further advantages of the invention will become apparent as the following description proceeds.

SUMMARY OF THE INVENTION

This invention incorporates several compact high-voltage arrays where each array is used as a high voltage switch. Each high voltage switch is a series of transistors placed into a single package that is small enough for a number of these devices to be placed into a replacement distributor cap for a combustion engine with any number of cylinders.

The advantage of this invention is that a single photodiode activates the high voltage array. The high capacity and small transistor size allow assembly of an array into a small package which in turn readily fits within dimensional constraints of a standard size distributor cap. The single activation point of each array, with incident light energy, allows for the use of a light directing rotor to be used in place of an automobile's electrically directing rotor. This optically triggered distributor cap and light directing rotor can be adapted to any type of mechanical or electrical distributor.

The light source for the light directing rotor is located at the center of the distributor cap and is projected down towards the center of the light directing rotor. The light enters the center of the rotor and an appropriate reflecting material reflects it at a 45 degree angle, from the entry direction, from the center of the rotor outwards to the end of the rotor arm. At the end of the rotor arm light reflecting material again reflects the light at a 45 degree angle up towards the bottom side of the distributor cap. The high voltage arrays are positioned in such a way as to allow the photo-diode of each array to be placed in the circular light path of the light directing rotor. The arrays are placed at appropriate spaced positions intersecting the circular light path of the light directing rotor to insure that triggering of ignition voltage to appropriate spark plugs. The spacing of the arrays will depend on the number of cylinders and type of car.

The ignition voltage connection for this distributor cap is off center. A circular bus or ring distributes ignition voltage. This ring provides the electrical path for the ignition voltage to each high voltage array. The available low voltage source powers the light source, photo-diode and low voltage transistors.

Briefly stated and according to the present invention, there is provided a contactless, optically switched distributor for use in a contactless optically switched ignition system.

Figure 1:
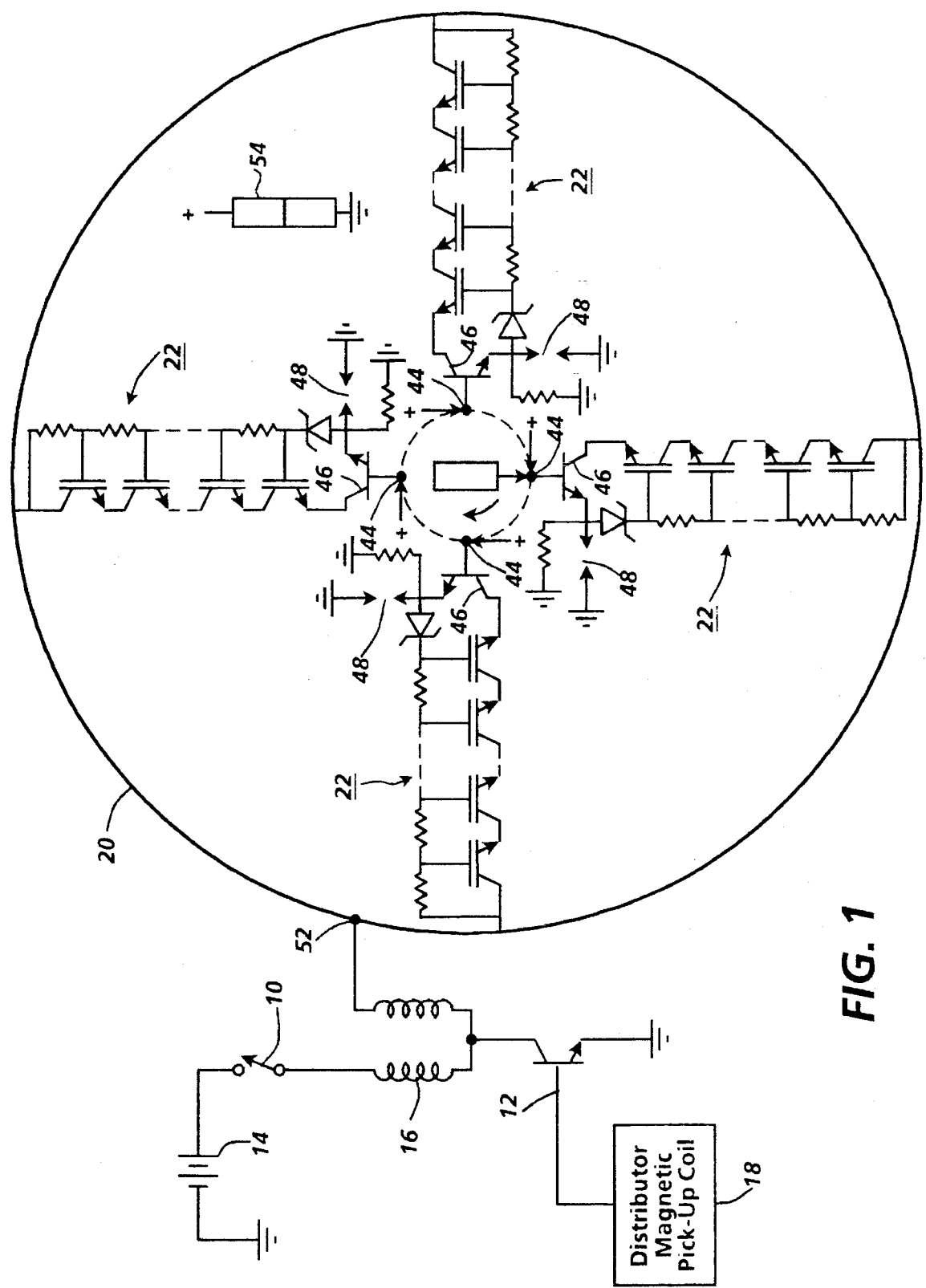
FIG. 1 is a circuit diagram of an ignition system that has an electronic distributor in accordance with this invention.

While the present invention will be described in connection with a preferred embodiment or method of use, it will be understood that it is not intended to limit the invention to that embodiment or procedure. On the contrary, it is intended to cover all alternatives, modifications and equivalents as may be included within the spirit and scope of the invention as defined by the appended claims.

Alpha-Numeric List of Elements ignition switch 10 ignition transistor 12 battery 14 coil 16 distributor magnetic pick-up coil 18 high voltage bus 20 high voltage arrays 22 light source 24 circuit mounting plane 26 distributor cap 28 light directing rotor 30 reflecting surface 32 light beam 34 rotor arm 36 reflecting surface 38 circular path 40 distributor shaft 42 photo-diode 44 low voltage transistor 46 spark plug 48 high voltage output terminals 50 input terminal 52 two pin connector 54

DETAILED DESCRIPTION OF THE INVENTION

FIG. 1 is a circuit diagram illustrating an ignition system used in a four cylinder combustion engine. The invention is not limited to a four cylinder combustion engine and it can be used with any size engine. A four cylinder engine was chosen for ease of illustration only. High voltage generation is shown in a generic form and does not show details of electronic coil timing or computer conditioning because those are not features of the invention.

An ignition switch 10 is switched on and an ignition transistor 12 controls current flow from a battery 14 to a coil 16. The ignition transistor 12 receives the correct firing sequence from a distributor magnetic pick-up coil 18 or an ignition computer (not shown). The high voltage travels from the coil 16 to a high voltage bus 20 where it is available to a series of high voltage arrays 22.

Figure 2:
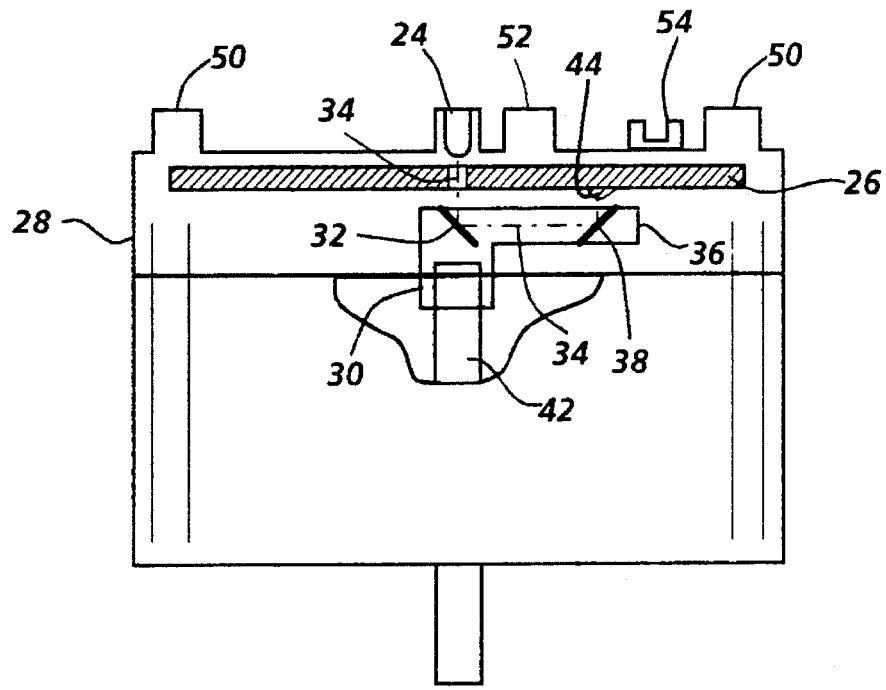
FIG. 2 is a sectional side view, parallel to an axis of rotation of a distributor cap.

In FIG. 2 a light source 24, located centrally in distributor cap 28, is directed downward through a circuit mounting plane 26 in the distributor cap 28. An unobstructed path is made available for light from light source 24 to ensure that it is directed into the center of a light directing rotor 30. The center of the rotor 30 has a reflecting surface 32 placed at a 45 degree angle, with respect to the light path from the source, which will direct light beam 34 from the center of the light directing rotor 30 out toward the end of the rotor arm 36. At the end of the rotor arm 36 is another reflecting surface 38 placed again at a 45 degree angle, with respect to the light path from reflecting surface 32, so as to direct the light beam 34 upwards toward the circuit mounting plane 26 in the distributor cap 28. Circuitry may be molded directly into the distributor cap 28 or mounted on a circuit board.

Figure 3:
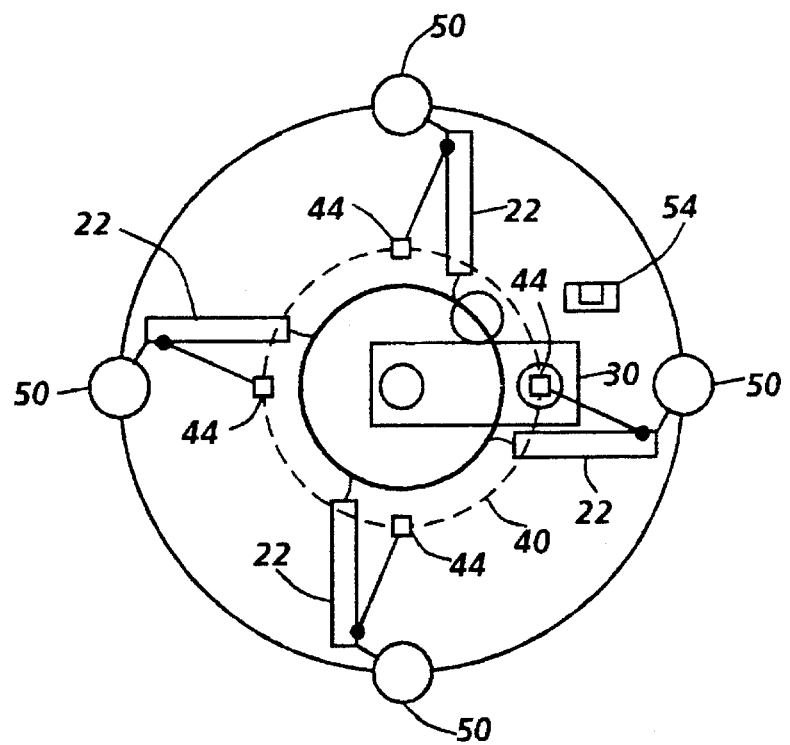
FIG. 3 is a bottom view, perpendicular to the axis of rotation, of a distributor cap.

In FIG. 3, the light directing rotor 30 illuminates a circular path 40 on the bottom of the circuit mounting plane 26 in the distributor cap 28 as it rotates. The motion of the rotor 38 is controlled by mechanical rotation provided by a distributor shaft 42.

The high voltage arrays 22 are located such that a photo-diode 44 is located in the light path 40 at a precise location to insure that array 22 is activated allowing distribution of ignition voltage at the correct time. The light beam 34 from the light source 24 will bias the appropriate photo-diode 44 which in turn allows low voltage to activate a low voltage transistor 46, included in each high voltage array 22, to turn that high voltage array 22 on. The activated array 22 completes an electrical path from the high voltage bus 20 to an appropriate spark plug 48 as shown in FIG. 1.

An input terminal 52 is also standard but is mounted off-center to align with the circular high voltage bus 20. A two pin connector 54 is also mounted on the distributor cap to provide the low voltage necessary for the photo-diode 44 and the low voltage transistor 46.

I claim:

1. An optical distributor comprising:

a) a light source for emitting a light beam, b) a rotatable light directing rotor, c) a stationary circuit mounting plane with at least two spaced apart photo-diodes, and d) said light source, rotatable light directing rotor, and circuit mounting plane being so constructed and arranged such that said rotatable light directing rotor receives light from said light source and directs the received light alternately to the at least two spaced photo-diodes.

2. The optical distributor of claim 1 wherein the rotatable light directing rotor further comprises first and second reflecting surfaces, so constructed and arranged such that the first reflecting surface will receive a beam of light emitted from said light source and will reflect the light beam towards the second reflecting surface, where it will be received by the second reflecting surface and reflected away from said light directing rotor alternately towards the at least two spaced photo-diodes.

3. An optical distributor comprising:

a) a light source for emitting a light beam, b) a rotatable light directing rotor, c) a stationary circuit mounting plane with at least two spaced apart means responsive to the light beam for activating electronic circuitry, and d) said light source, rotatable light directing rotor, and circuit mounting plane being so constructed and arranged such that said rotatable light directing rotor receives light from said light source and directs the received light alternately to the at least two spaced apart means responsive to the light beam for activating electronic circuitry.

4. The optical distributor of claim 3 wherein the rotatable light directing rotor further comprises first and second reflecting surfaces, so constructed and arranged such that the first reflecting surface will receive a beam of light emitted from said light source and will reflect the light beam towards the second reflecting surface, where it will be received by the second reflecting surface and reflected away from said light directing rotor alternately towards the at least two spaced apart means responsive to the light beam for activating electronic circuitry.

5. The optical distributor of claim 3 wherein the means responsive to the light beam further comprises a high voltage electronic switch.

6. The optical distributor of claim 5 wherein said high voltage electronic switch is mounted on said stationary circuit mounting plane.

* * * * *